(12) United States Patent
Manassen et al.

(10) Patent No.: US 9,255,787 B1
(45) Date of Patent: Feb. 9, 2016

(54) MEASUREMENT OF CRITICAL DIMENSION AND SCANNER ABERRATION UTILIZING METROLOGY TARGETS

(71) Applicant: KLA-Tencor Corporation, Milpitas, CA (US)

(72) Inventors: Amnon Manassen, Haifa (IL); Barry Loevsky, Yokneam Illit (IL)

(73) Assignee: KLA-Tencor Corporation, Milpitas, CA (US)

( * ) Notice: Subject to any disclaimer, the term of this patent is extended or adjusted under 35 U.S.C. 154(b) by 93 days.

(21) Appl. No.: 14/160,217

(22) Filed: Jan. 21, 2014

Related U.S. Application Data

(60) Provisional application No. 61/754,755, filed on Jan. 21, 2013.

(51) Int. Cl.
*G06K 9/00* (2006.01)
*G01B 11/02* (2006.01)
*G06T 7/00* (2006.01)

(52) U.S. Cl.
CPC .............. *G01B 11/02* (2013.01); *G06T 7/0004* (2013.01); *G06K 9/00* (2013.01)

(58) Field of Classification Search
CPC ... G03F 7/70633; G03F 7/0002; G03F 1/144; G03F 7/70625; G03F 9/7088; G03F 7/7065; G03F 9/7076; G03F 7/705; G03F 1/84; G01N 21/956; G01N 21/9503; G01N 21/9501; H01L 23/544; H01L 2924/00; G01B 2210/56; Y10S 148/102; G06T 2207/30148; G06T 7/0004
USPC ................. 356/363, 399, 401, 625, 635, 636; 382/145, 149, 151
See application file for complete search history.

(56) References Cited

U.S. PATENT DOCUMENTS

| | | | |
|---|---|---|---|
| 4,643,579 A | | 2/1987 | Toriumi et al. |
| 4,929,083 A | | 5/1990 | Brunner |
| 4,973,136 A | * | 11/1990 | Braatz ............... G02F 1/133553 250/331 |
| 5,086,477 A | | 2/1992 | Yu et al. |
| 5,151,750 A | | 9/1992 | Magome et al. |
| 5,216,257 A | | 6/1993 | Brueck et al. |
| 5,583,609 A | | 12/1996 | Mizutani et al. |
| 5,602,492 A | * | 2/1997 | Cresswell et al. ......... 324/750.3 |
| 5,712,707 A | | 1/1998 | Ausschnitt et al. |
| 5,723,236 A | | 3/1998 | Inoue et al. |
| 5,731,877 A | * | 3/1998 | Ausschnitt .................... 356/620 |
| 5,753,416 A | | 5/1998 | Okamoto et al. |

(Continued)

FOREIGN PATENT DOCUMENTS

| | | |
|---|---|---|
| KR | 2003053224 A | 6/2003 |
| KR | 2006019761 A | 3/2006 |
| WO | 2013132064 A2 | 9/2013 |

*Primary Examiner* — Vu Le
*Assistant Examiner* — Aklilu Woldemariam
(74) *Attorney, Agent, or Firm* — Suiter Swantz pc llo

(57) ABSTRACT

Metrology targets and method of using the metrology targets for measurement of critical dimension, overlay or scanner aberration are disclosed. A target may include an unresolved grid having a plurality of lines spaced equally apart from each other according to a pre-determined pitch distance and at least one resolved feature tilted at an angle with respect to the unresolved grid. The method may indentify multiple regions of interest (ROIs) and determine a series of center points between the ROIs as the ROIs are being shifted. Critical dimension, overlay or scanner aberration may be calculated by analyzing the series of center points between the ROIs.

19 Claims, 12 Drawing Sheets

(56) References Cited

U.S. PATENT DOCUMENTS

| | | | |
|---|---|---|---|
| 5,757,507 A | 5/1998 | Ausschnitt et al. | |
| 5,805,290 A | 9/1998 | Ausschnitt et al. | |
| 5,965,307 A | 10/1999 | Miyatake | |
| 6,150,231 A | 11/2000 | Muller et al. | |
| 6,301,798 B1 | 10/2001 | Liu et al. | |
| 6,538,740 B1 | 3/2003 | Shiraishi et al. | |
| 6,660,462 B1 | 12/2003 | Fukuda | |
| 6,730,444 B2* | 5/2004 | Bowes | 430/5 |
| 6,742,168 B1* | 5/2004 | Nariman | 438/7 |
| 6,788,393 B2 | 9/2004 | Inoue | |
| 6,812,045 B1* | 11/2004 | Nikoonahad et al. | 438/14 |
| 6,836,560 B2 | 12/2004 | Emery | |
| 6,887,625 B2* | 5/2005 | Baselmans et al. | G03F 7/70433 430/30 |
| 6,898,306 B1 | 5/2005 | Lu | |
| 7,058,221 B1 | 6/2006 | Shikata | |
| 7,180,593 B2 | 2/2007 | Lin | |
| 7,242,477 B2 | 7/2007 | Mieher et al. | |
| 7,288,344 B2* | 10/2007 | Frost | G03F 1/36 430/30 |
| 7,440,105 B2 | 10/2008 | Adel et al. | |
| 7,465,591 B2* | 12/2008 | Borden | G01N 21/95607 257/E21.53 |
| 7,528,941 B2 | 5/2009 | Kandel et al. | |
| 7,557,921 B1 | 7/2009 | Adel et al. | |
| 7,626,702 B2 | 12/2009 | Ausschnitt et al. | |
| 7,629,697 B2 | 12/2009 | Van Haren et al. | |
| 7,751,046 B2 | 7/2010 | Levy et al. | |
| 7,847,939 B2 | 12/2010 | Smith et al. | |
| 7,873,504 B1* | 1/2011 | Bevis | G03F 1/144 356/252 |
| 7,879,627 B2* | 2/2011 | Ghinovker et al. | 438/14 |
| 8,441,639 B2 | 5/2013 | Kandel et al. | |
| 8,681,413 B2 | 3/2014 | Manassen et al. | |
| 2001/0007498 A1 | 7/2001 | Arai et al. | |
| 2002/0041377 A1 | 4/2002 | Hagiwara et al. | |
| 2002/0158193 A1* | 10/2002 | Sezginer | G03F 7/70633 250/237 G |
| 2003/0021465 A1 | 1/2003 | Adel et al. | |
| 2003/0223630 A1* | 12/2003 | Adel et al. | 382/145 |
| 2003/0224261 A1* | 12/2003 | Schulz | G01B 11/272 430/22 |
| 2004/0004726 A1* | 1/2004 | Sezginer et al. | 356/601 |
| 2004/0040003 A1 | 2/2004 | Seligson et al. | |
| 2004/0184652 A1* | 9/2004 | Tsuchiya | G06T 7/001 382/144 |
| 2004/0233439 A1 | 11/2004 | Mieher et al. | |
| 2005/0105092 A1* | 5/2005 | Ausschnitt et al. | 356/401 |
| 2005/0140986 A1 | 6/2005 | Butler | |
| 2005/0173634 A1* | 8/2005 | Wong et al. | 250/311 |
| 2005/0195398 A1 | 9/2005 | Adel et al. | |
| 2005/0272221 A1 | 12/2005 | Yen et al. | |
| 2006/0051682 A1* | 3/2006 | Hess | G03F 1/144 430/5 |
| 2006/0210893 A1 | 9/2006 | Van Bilsen | |
| 2006/0269848 A1* | 11/2006 | Setta | 430/5 |
| 2007/0058169 A1 | 3/2007 | Ausschnitt et al. | |
| 2007/0069398 A1* | 3/2007 | Smith | G03F 7/70633 257/797 |
| 2007/0096094 A1* | 5/2007 | Levinski | G03F 7/70633 257/48 |
| 2007/0158580 A1* | 7/2007 | Ward | B82Y 10/00 250/426 |
| 2007/0158581 A1* | 7/2007 | Ward | B82Y 10/00 250/426 |
| 2007/0158582 A1* | 7/2007 | Ward | B82Y 10/00 250/426 |
| 2007/0230770 A1* | 10/2007 | Kulkarni et al. | 382/149 |
| 2007/0279630 A1 | 12/2007 | Kandel et al. | |
| 2008/0094639 A1 | 4/2008 | Widmann et al. | |
| 2008/0112609 A1* | 5/2008 | Inoue | G03F 7/70391 382/151 |
| 2008/0279442 A1* | 11/2008 | Den Boef | G03F 1/84 382/144 |
| 2008/0279444 A1* | 11/2008 | Fischer | G01N 21/9501 382/145 |
| 2009/0001615 A1 | 1/2009 | Li et al. | |
| 2009/0136117 A1* | 5/2009 | Barkol | G01N 21/93 382/145 |
| 2009/0187383 A1* | 7/2009 | Li et al. | 702/191 |
| 2009/0195768 A1* | 8/2009 | Bijnen | G03F 9/7076 355/77 |
| 2009/0220872 A1 | 9/2009 | Oishi | |
| 2009/0243095 A1 | 10/2009 | Fujita et al. | |
| 2010/0052191 A1 | 3/2010 | Trogisch et al. | |
| 2011/0069314 A1* | 3/2011 | Ausschnitt | G03F 7/70633 356/401 |
| 2011/0076789 A1 | 3/2011 | Kuroda | |
| 2011/0155904 A1* | 6/2011 | Hotta | G03F 7/70466 250/307 |
| 2011/0249247 A1* | 10/2011 | Cramer et al. | 355/55 |
| 2012/0146159 A1 | 6/2012 | Wang et al. | |
| 2012/0206729 A1 | 8/2012 | Seligson et al. | |
| 2012/0243004 A1* | 9/2012 | El Gawhary | G01B 11/24 356/601 |
| 2013/0083306 A1 | 4/2013 | Smirnov et al. | |
| 2013/0271740 A1 | 10/2013 | Quintanilha | |
| 2013/0304424 A1* | 11/2013 | Bakeman et al. | 702/189 |
| 2014/0065832 A1 | 3/2014 | Hsieh et al. | |

\* cited by examiner

MEASUREMENT OF CRITICAL DIMENSION AND SCANNER ABERRATION UTILIZING METROLOGY TARGETS

CROSS-REFERENCE TO RELATED APPLICATIONS

The present application claims the benefit under 35 U.S.C. §119(e) of U.S. Provisional Application Ser. No. 61/754,755, filed Jan. 21, 2013. Said U.S. Provisional Application Ser. No. 61/754,755 is hereby incorporated by reference in its entirety.

TECHNICAL FIELD

The disclosure generally relates to the field of semiconductor fabrication, particularly to configurations of metrology targets used for semiconductor device fabrication.

BACKGROUND

Thin polished plates such as silicon wafers and the like are a very important part of modern technology. A wafer, for instance, refers to a thin slice of semiconductor material used in the fabrication of integrated circuits and other devices. Other examples of thin polished plates may include magnetic disc substrates, gauge blocks and the like. Modern semiconductor devices are typically fabricated from layers of semiconductor, conductor or isolator material printed on wafers using photolithography techniques. Providing precise positioning, alignment and critical dimension (CD) measurement during semiconductor fabrication is of critical importance.

SUMMARY

The present disclosure is directed to a method for measuring a semiconductor wafer critical dimension. The method includes: obtaining an image of the semiconductor wafer; identifying a plurality of metrology targets from the image of the semiconductor wafer, each of the plurality of metrology targets including an unresolved grid, a first resolved feature and a second resolved feature, wherein at least one of the first resolved feature and the second resolved feature is tilted at an angle with respect to the unresolved grid; for each of the plurality of metrology targets, defining a first region of interest (ROI) for the first resolved feature and a second ROI for the second resolve feature; for each of the plurality of metrology targets, determining a series of center points between the first ROI and the second ROI as the first ROI and the second ROI are being shifted; calculating a summation of the center points between the first ROI and the second ROI for all of the plurality of metrology targets; and measuring the critical dimension based on a symmetry analysis of the summation of the center points between the first ROI and the second ROI for all of the plurality of metrology targets.

A further embodiment of the present disclosure is directed to a metrology system. The metrology system includes an imaging device configured for obtaining an image of a semiconductor device. The metrology system also includes a processor. The processor is configured for: identifying at least one metrology target from the image of the semiconductor device, each of the at least one metrology target including an unresolved grid and at least one resolved feature tilted at an angle with respect to the unresolved grid; for each of the at least one metrology target, defining a first region of interest (ROI) and a second ROI; for each of the at least one metrology target, determining a series of center points between the first ROI and the second ROI as the first ROI and the second ROI are being shifted; and analyzing the semiconductor device based on the series of center points between the first ROI and the second ROI.

Furthermore, the present disclosure is directed to a metrology target. The metrology target includes an unresolved grid having a plurality of lines spaced equally apart from each other according to a pre-determined pitch distance. The metrology target further includes at least one resolved feature tilted at an angle with respect to the unresolved grid.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Critical dimension (CD) such as the minimum width of a feature (e.g., a line or the like) is measured during semiconductor fabrication. If the critical dimension measured is equal to or in compliance with a predefined range of acceptable dimensions, the fabrication process may proceed. On the other hand, if the critical dimension measured does not equal to or is not in compliance within the acceptable range, the fabrication process may be halted.

Figure 1:
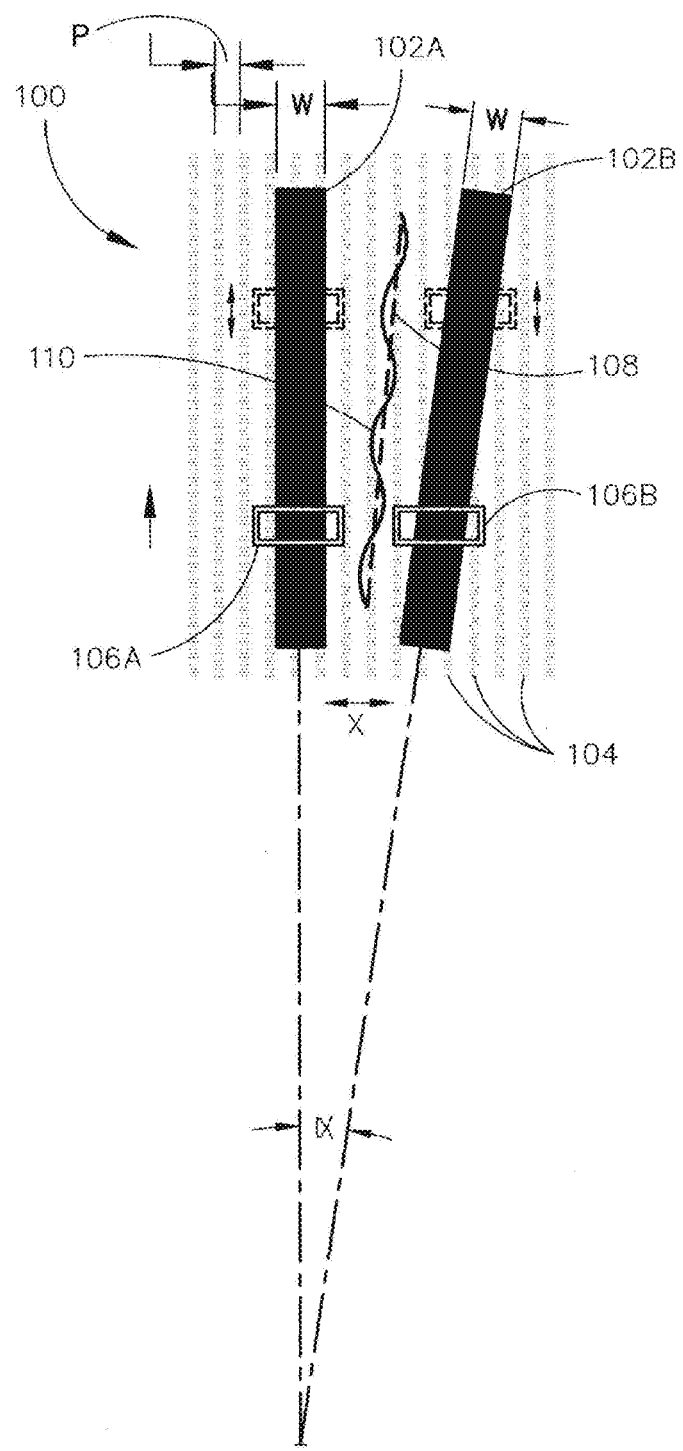
FIG. 1 is an illustration depicting a metrology target having an anchor feature and a tilted feature.

One embodiment of the present disclosure is directed to a method and system for measuring critical dimension (CD) and device level overlay (e.g., overlay of the segmentations, unresolved lines or the like) utilizing a metrology target that includes both resolved features and unresolved features. Referring to FIG. 1, an illustration depicting such a metrology target 100 in accordance with an embodiment of the present disclosure is shown. More specifically, the target 100 includes both resolved features 102 and unresolved features 104. The unresolved features 104 (e.g., shown as vertical lines in this example) are grouped closely together and are too small to be individually resolved optically by imaging tools (e.g., microscopes) of a metrology system. Such unresolved features 104 are commonly used in overlay targets, and they may also be referred to as segmentations or grids.

In addition to the unresolved features 104, the target 100 also includes two resolved features 102 overlapping with the unresolved features 104. More specifically, the first resolved feature 102A is configured to be parallel to the segmentation while the second resolved feature 102B is tilted at an angle α relative to the segmentation.

Now consider implementing imaging overlay algorithms to determine the center between the Region of Interest (ROI), identified in the figure by rectangles 106A and 106B, as these ROI's are being shifted in the vertical direction. In the absence of segmentation 104, the center between the ROI's as the ROI's are being shifted should form a straight line 108 tilted towards feature 102B at an α/2 angle. However, in the presence of the segmentation 104, the tilted edges of the feature 12B overlaps with the segmentation grid 104, producing errors that fluctuate when the ROI's 106 are shifted in the vertical direction. This result is illustrated as a curved line 110 in FIG. 1.

Figure 2:
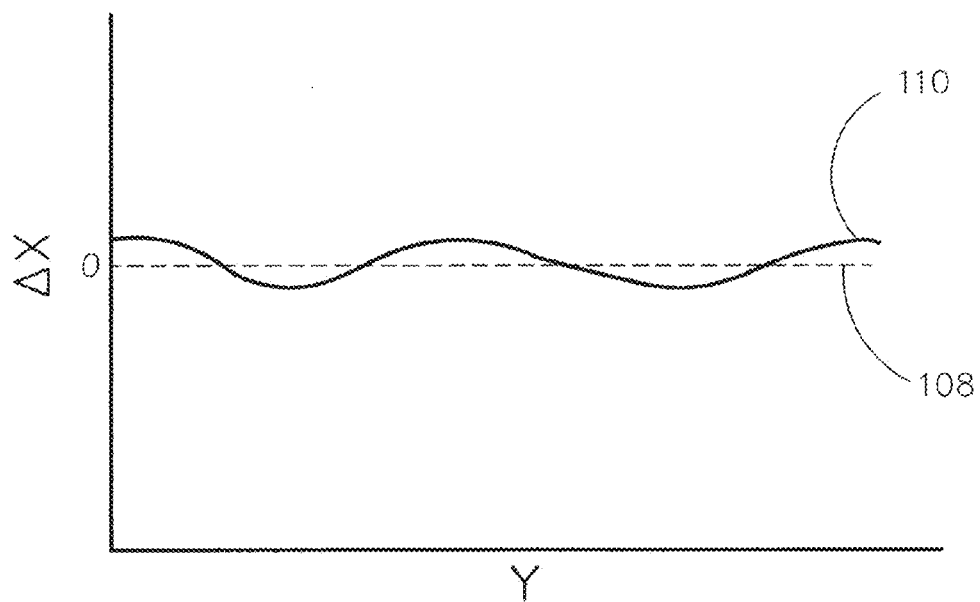
FIG. 2 is an illustration depicting the relationship between two center lines of FIG. 1.

FIG. 2 illustrates the relationship between line 108 and line 110 of FIG. 1. The horizontal axis in FIG. 2 corresponds to the shifting of the ROI's in the Y direction in FIG. 1. The vertical axis in FIG. 2 corresponds to the difference of line 110 in comparison to line 108 in the X direction in FIG. 1. It is noted that this sinusoidal behavior of the curved line 110 is expected due to the periodical behavior of the overlay error which in turn is closely related to the pitch of the segmentation (P) and the critical dimension (CD). Therefore, targets similar to the target 100 depicted in the example above can be designed and utilized for measurement of CD.

Figure 3:
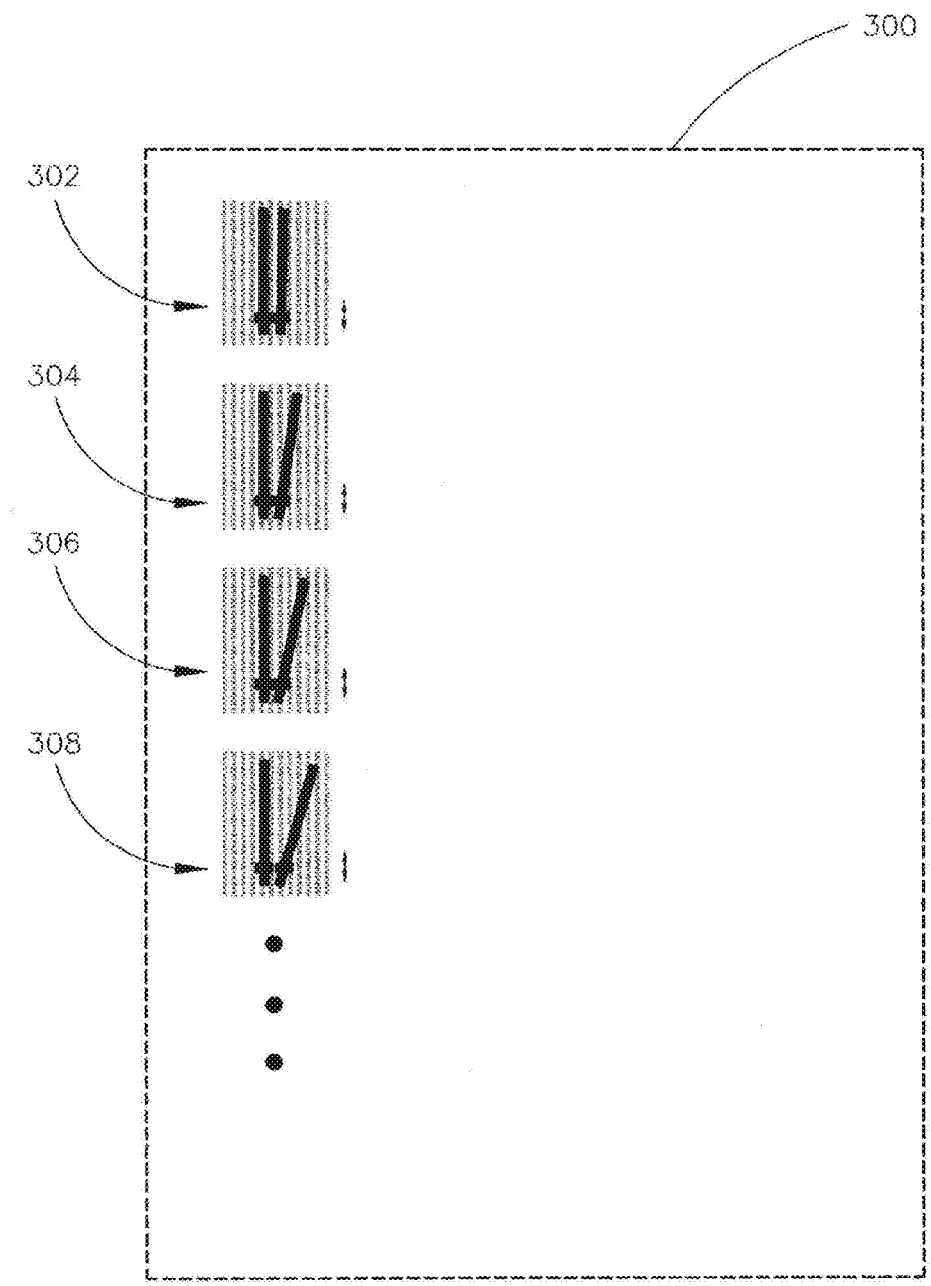
FIG. 3 is an illustration depicting a series of metrology targets for critical dimension measurement.

FIG. 3 is an illustration depicting the targets for CD measurements in accordance with one embodiment of the present disclosure. As shown in FIG. 3, a plurality of targets 302 through 308 may be positioned on a semiconductor wafer 300. Each of these targets includes two resolved features positioned at an angle as described above. In addition, the angle formed by the resolved features in each one of these targets is slightly different from the others. That is, the α angles in targets 302 through 308 are all different.

Once the image of the wafer 300 is obtained by the metrology system, each target 302 through 308 may then be identified and processed individually using various imaging overlay algorithms to determine the center between the ROI's as the ROI's are being shifted in the vertical direction. Since segmentation is present in all of these targets, fluctuating errors as illustrated above are expected for all of these targets. To illustrate this, FIG. 4 shows the center lines obtained for these targets after applying the same transformation utilized to derive FIG. 2 from FIG. 1.

Figure 4:
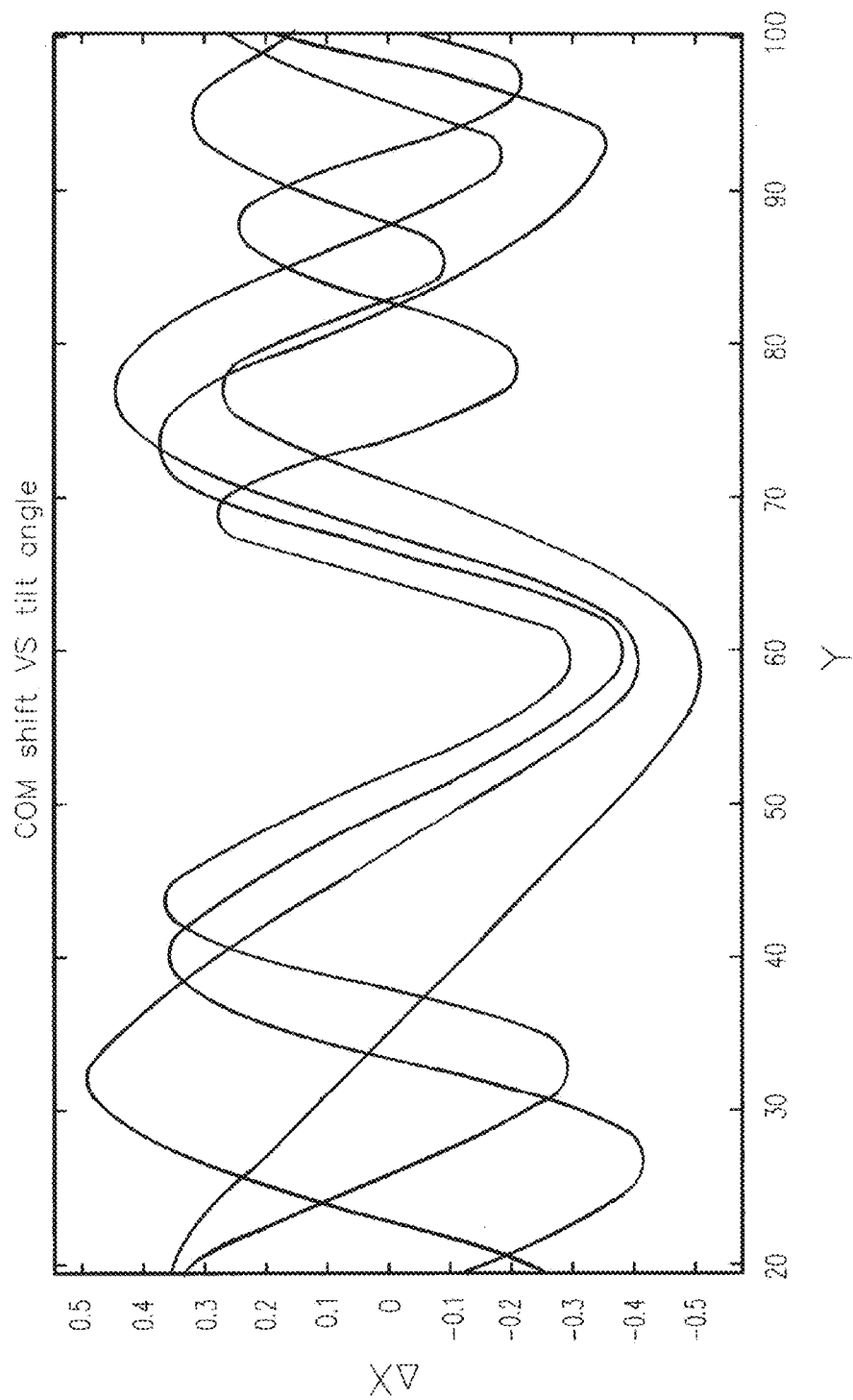
FIG. 4 is an illustration depicting various center lines obtained for the series of metrology targets.
Figure 5:
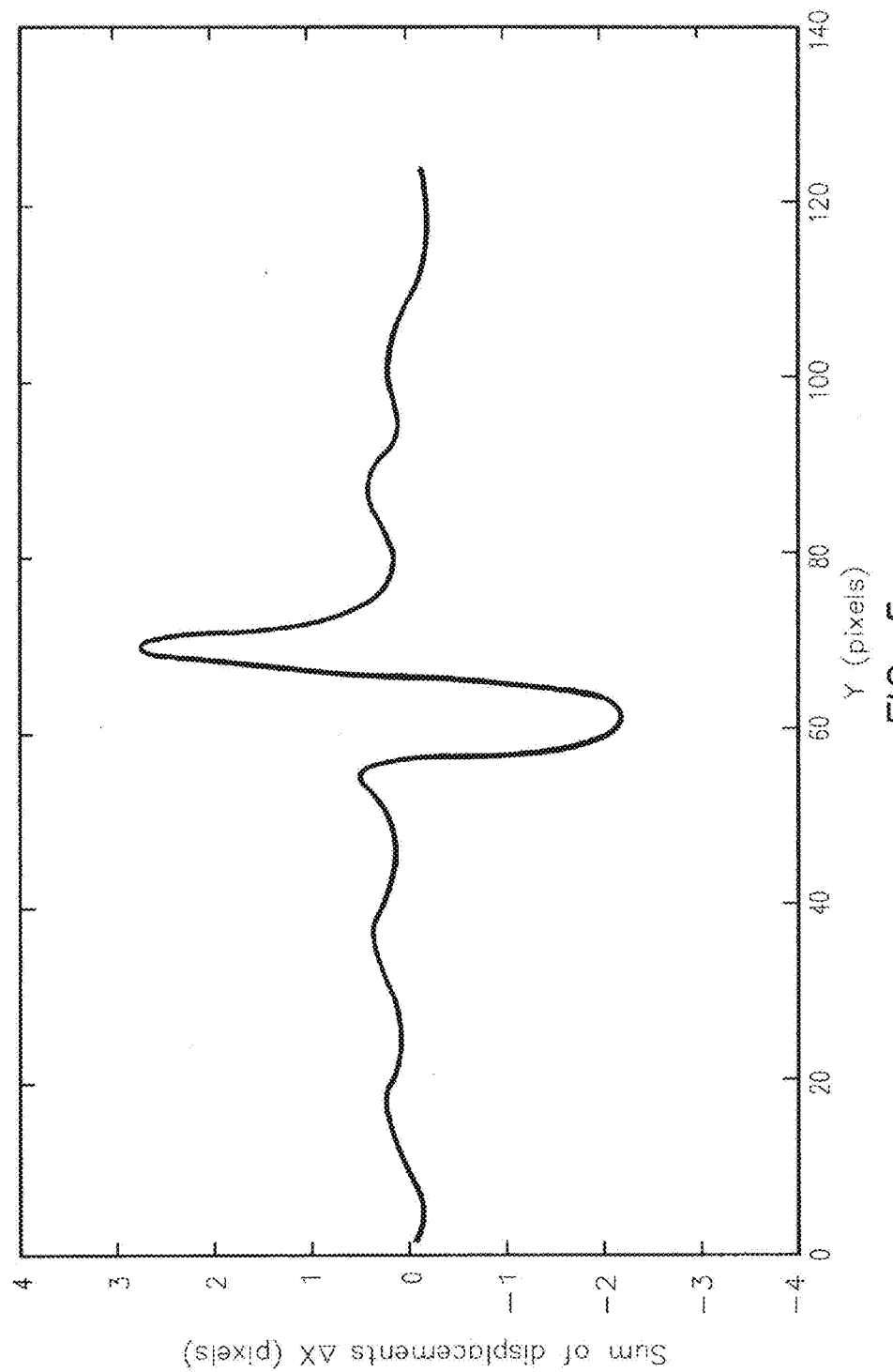
FIG. 5 is an illustration depicting a summation of the center lines of FIG. 4.

Now, as illustrated in FIG. 4, it is noted that since the α angles in targets 302 through 308 are different, the center lines obtained for these targets may have different sinusoidal behaviors as the result. It is also noted that a summation of all these center lines will result in a curve as shown in FIG. 5 with clear asymmetry that is caused by CD shift. It is contemplated that the CD can be extracted from asymmetry of the periodic sine-like function. For instance, if the CD is approximately 0.5 times the pitch of the segmentation, symmetric signal is expected. Otherwise, asymmetric behavior will grow with the ratio between the pitch and CD. The relationship between the asymmetric behavior and the ratio between the pitch and CD may be observed overtime or predetermined based on past observations, allowing the ratio between the pitch and CD to be estimated based on asymmetry of the periodic sine-like function. Once the ratio between the pitch and CD is estimated, CD can be calculated accordingly based on the pitch and the estimated ratio.

It is contemplated that to further improve the accuracy of the process described above, each of the resolved features in the targets are configured to have a width (W) that is a multiple of the segmentation pitch (P). Mathematically, $w=m \cdot p$, where m is an integer greater than or equal to 1.

It is also contemplated that while the targets 302 through 308 in the example above are depicted as separate targets printed on the wafer, they are separated merely for illustrative purposes. That is, the segmentations present in targets 302 through 308 may jointly form a unified segmentation without departing from the spirit and scope of the present disclosure. In addition, it is contemplated that the targets are not required to be arranged in a vertically fashion. That is, the targets may be arranged horizontally, diagonally, distributed at various corners or the like without departing from the spirit and scope of the present disclosure.

Furthermore, it is contemplated that the number of targets that can be utilized to facilitate CD and/or overlay measurement is not limited to 4 as depicted in the figure. The specific number of targets may change based on the desired measurement accuracy, the amount of space available on the wafer, as well as other restrictions or specifications. In addition, other parameters such as the size and shape of the ROI's, the distance between each vertical shift and the like may also vary based on specific implementations conditions. For instance, ROI's being shifted at a smaller increment (or step) may provide more accurate measurement results, but may require more processing time. It is contemplated that specific implementations may vary from the examples described above without departing from the spirit and scope of the present disclosure.

Regardless of the specific implementations, embodiments above described that critical dimension (CD) may be measured utilizing measurement targets having both resolved features and unresolved features. It is contemplated that characterizing the target after process stabilization enables monitoring of CD stability using a single image grab and implementing overlay algorithms. This enables monitoring deviations out of the process window.

It is contemplated that in addition to facilitate measurement of CD, the tilted feature designs in accordance with the present disclosure may also be utilized for other applications as well. For instance, the tilted features as described above may be utilized for providing feedback about scanner aberrations. By definition, an aberration is the collective phase tilts, at different pupil points. The light passing through each pupil point forms a specific field spatial frequency. The local phase tilt, at a specific pupil point, causes a displacement of the corresponding spatial frequency. The collection of different spatial frequencies shifts is directly related to the collection of phase tilts in corresponding pupil points and is thus directly related to aberrations. Direct measurement of displacements, per spatial frequency, will thus yield information about aberrations of the scanner. The method proposed here to achieve this is printing different design rule level grids, having different pitches and measurement of their relative displacement.

Figure 6:
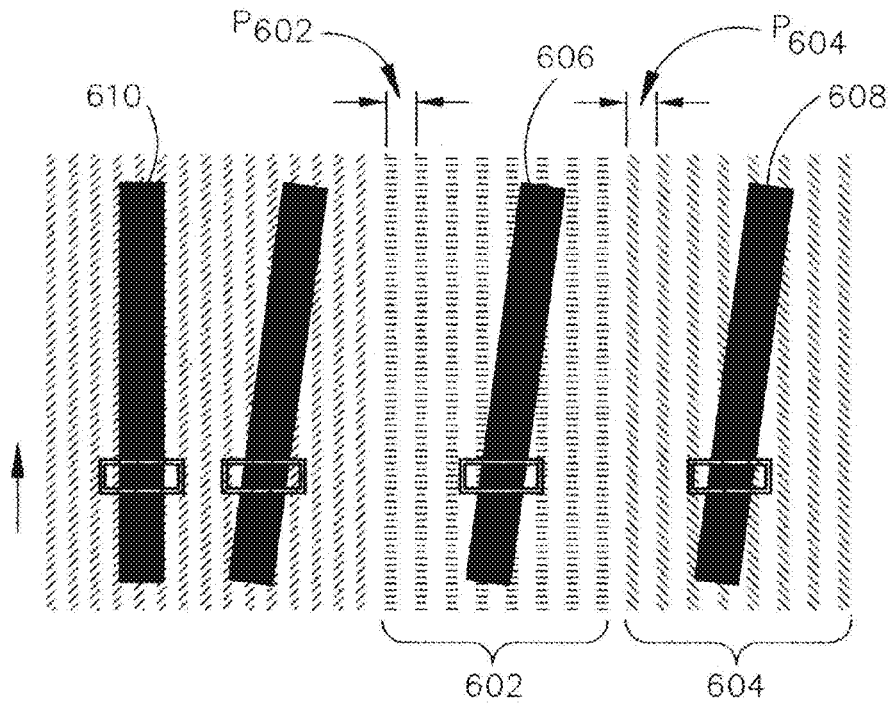
FIG. 6 is an illustration depicting a metrology target having at least two segmentations with different pitches.

FIG. 6 presents a target similar to the target presented in FIG. 1, with two additional grids 602 and 604 having different pitches added for illustrative purposes. In addition to grids 602 and 604, a resolved feature 606 overlapping with grid 602 and a similar resolved feature 608 overlapping with grid 604 are also present. It has been observed that the ROI's center measurement between features 606 and 608 relative to the anchor feature (feature 610 that is parallel to the segmentation) will yield sinusoidal lines with pitch dependent periods. The spectral phase between the periods is a direct representation of the shift per pitch, namely of scanner aberrations. Furthermore, using different resolved feature angles may yield additional information, which may be appreciated in various applications.

Figure 7:
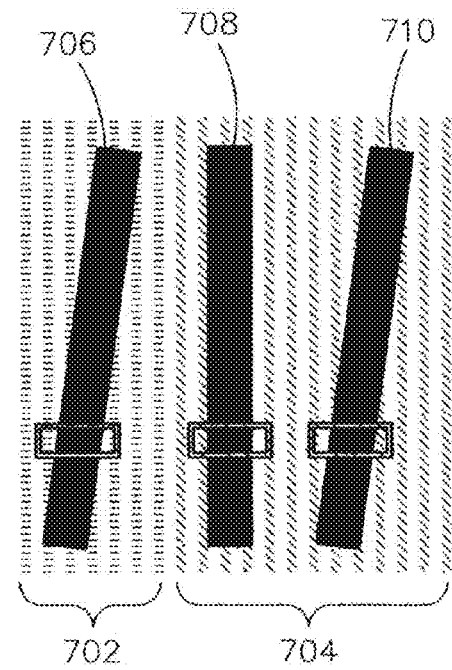
FIG. 7 is an illustration depicting a metrology target having at least two segmentations with the same pitch located on different layers.
Figure 8:
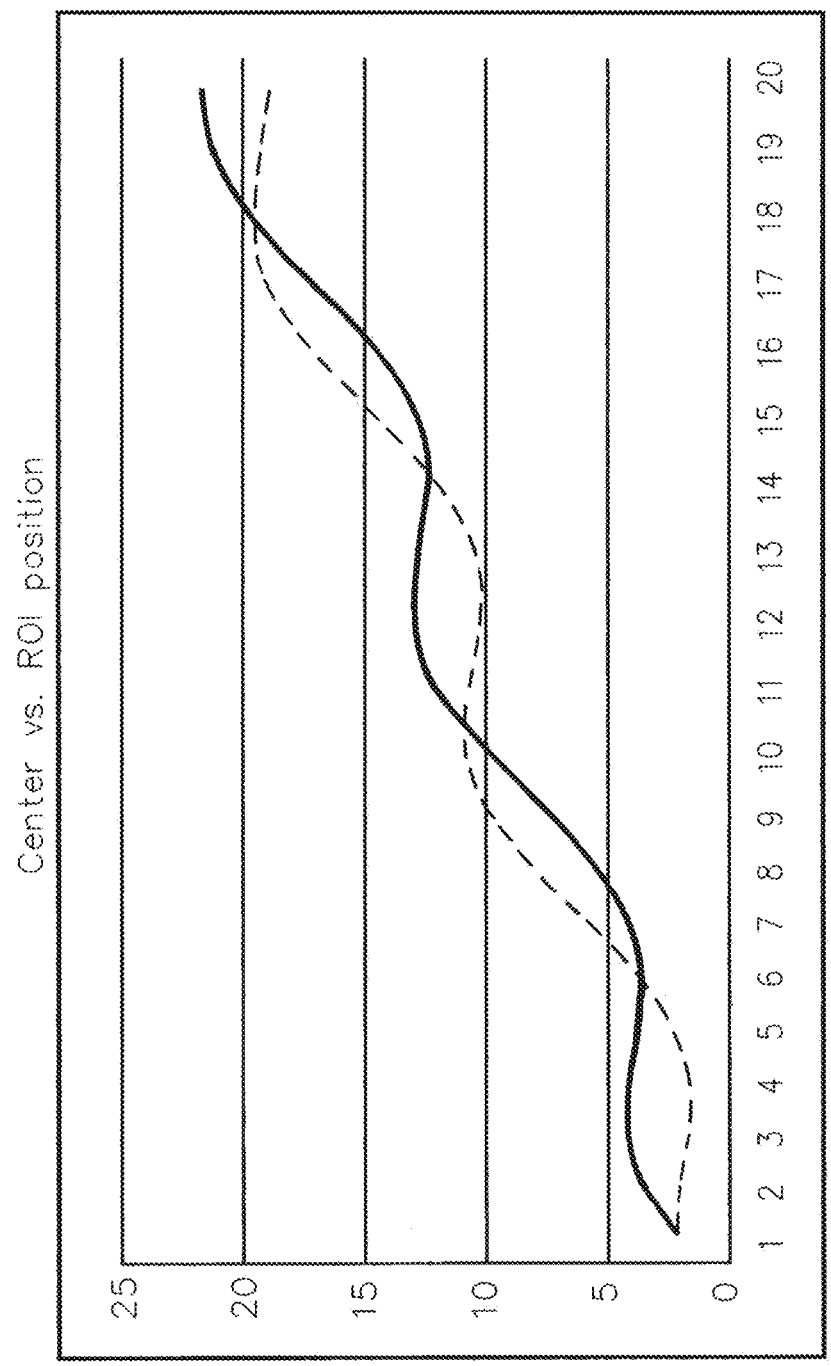
FIG. 8 is an illustration depicting the center measurement between two different tilted features relative to the anchor feature of FIG. 7.

Another application for using tilted feature designs in accordance with the present disclosure is to measure the displacement of two unresolved grids having the same pitch but belonging to different process layers. More specifically, as illustrated in FIG. 7, resolved features 706, 708 and 710 are positioned over unresolved grids 702 and 704. Grid 702 may belong to one layer (wafer) while grid 704 may belong to another layer. FIG. 8 depicts the center measurement between features 706 and 710 relative to the anchor feature 708. The phase difference between the periodic signals of the two layers indicates the overlay displacement of the two unresolved grids.

Figure 9:
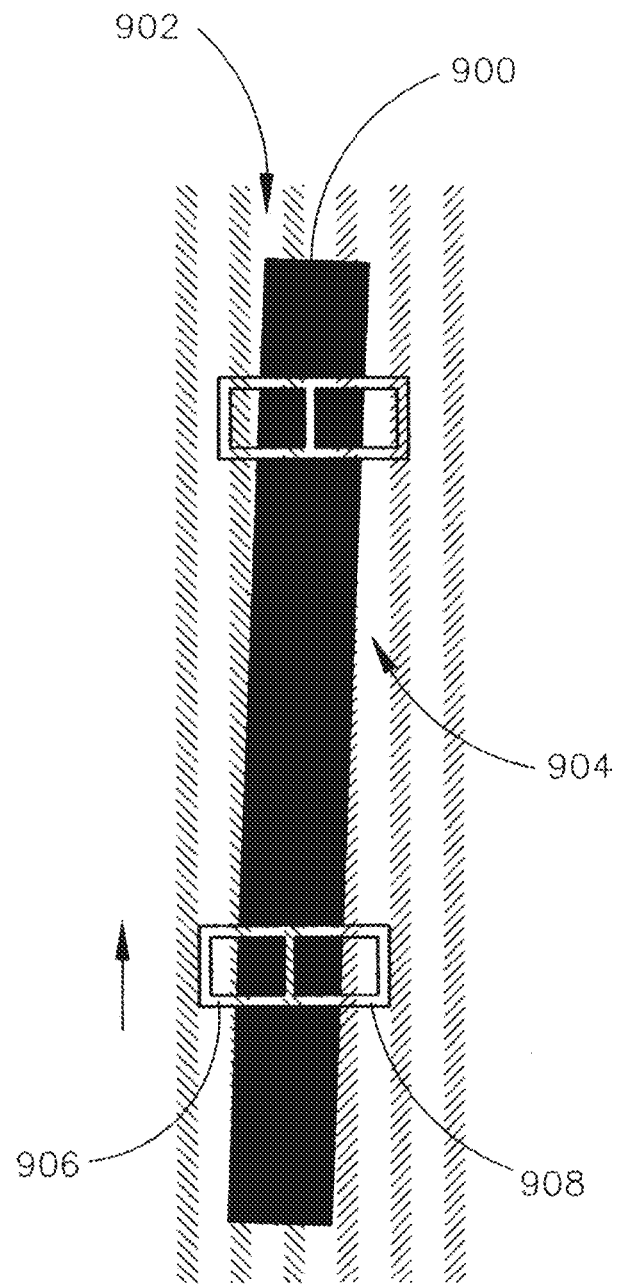
FIG. 9 is an illustration depicting a metrology target having a single tilted feature.

It is contemplated that while the embodiments described above all utilize two or more resolved features with at least one of them being parallel to the grid (referred to as the anchor feature), the requirement for such an anchor feature may be relaxed in an alternative embodiment. In this alternative embodiment, as illustrated in FIG. 9, both sides 902 and 904 of the resolved feature 900 are utilized for measurement rather than two resolved features as described previously. In this case, two adjacent ROI's 906 and 908 are defined and the center between the ROI's may be measurement and processed according to the techniques described above. It is understood that this alternative embodiment reduces target size and can still provide information needed to carry out the various processes as previously described.

Figure 10:
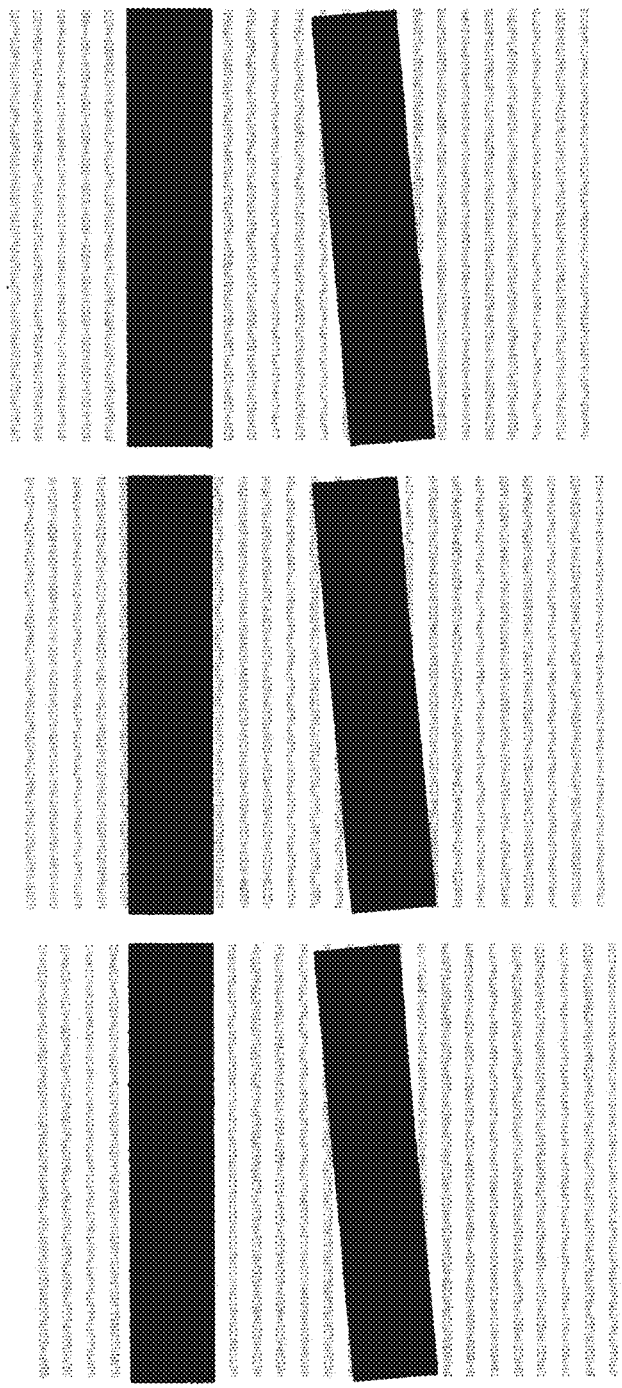
FIG. 10 is an illustration depicting metrology targets with different pitch overlay.
Figure 11:
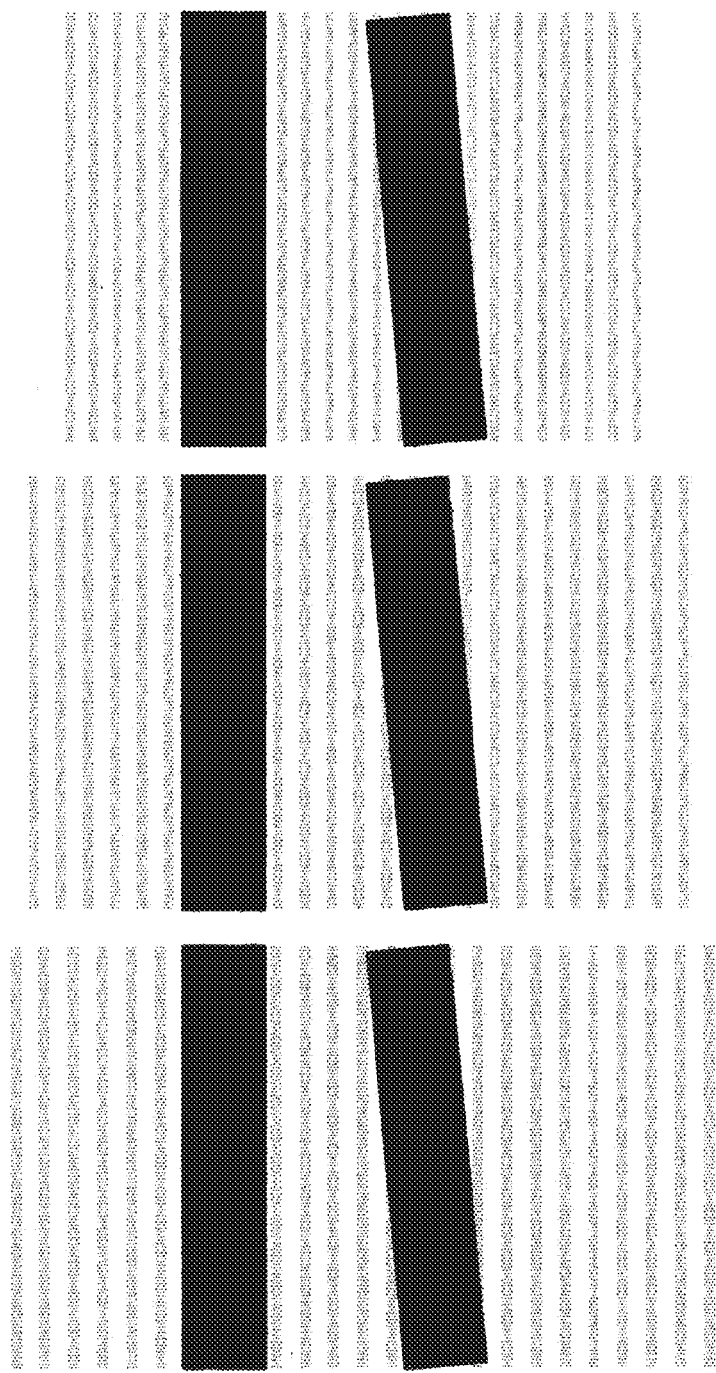
FIG. 11 is an illustration depicting metrology targets with different pitch.

It is further contemplated that other alternative targets may also be derived based on the tilted feature designs in accordance with the present disclosure. For instance, as shown in FIG. 10, targets with different pitch overlay may be utilized to extract the phase shift between subtargets. In addition, as shown in FIG. 11, targets with different pitch may be utilized to extract the pitch changes between subtargets. It is contemplated that the tilted feature designs in accordance with the present disclosure may also be utilized for other applications not specifically described above without departing from the spirit and scope of the present disclosure.

Figure 12:
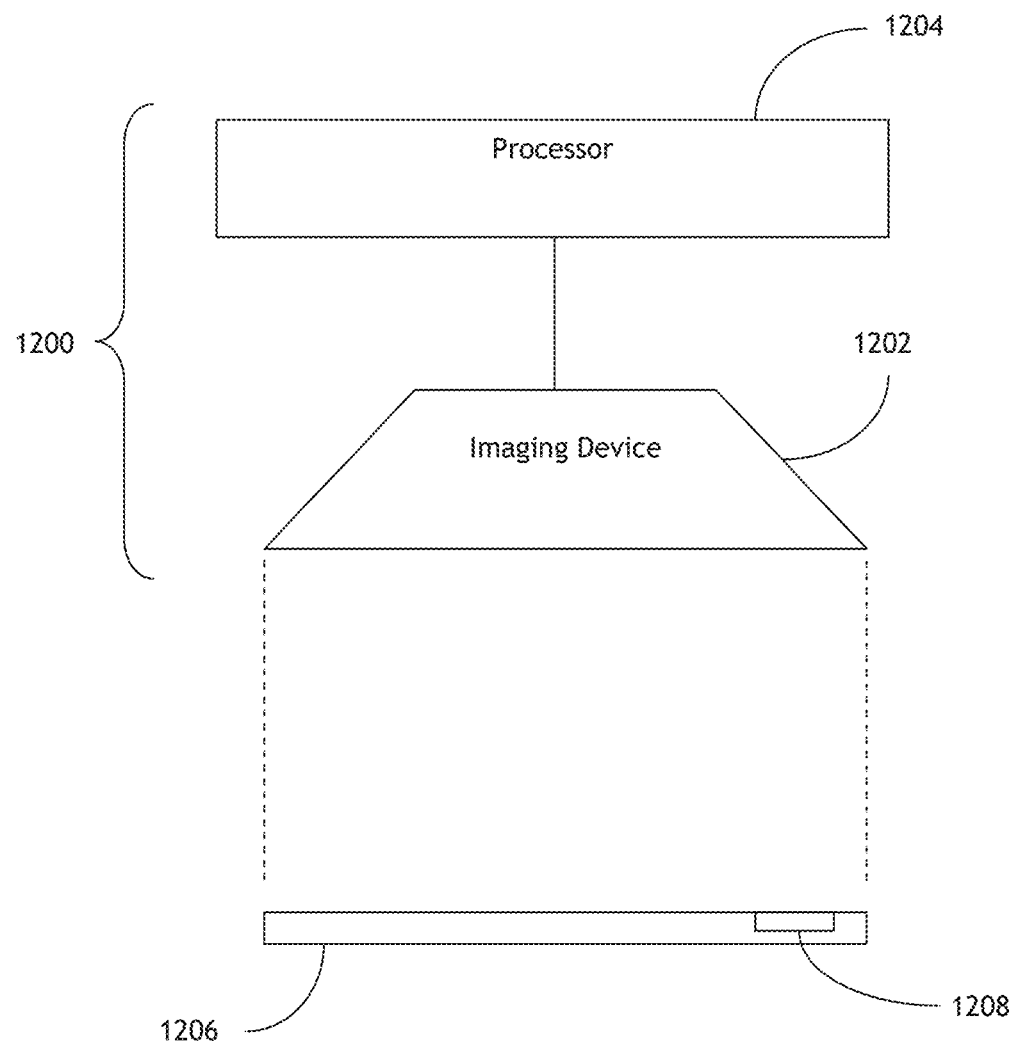
FIG. 12 is a block diagram depicting a metrology system.

Referring now to FIG. 12, a block diagram depicting a metrology system 1200 capable of performing the various measurement processes described above is shown. The metrology system 1200 may include an imaging devices (e.g., a scanner, a microscope or the like) 1202 configured for obtaining images of a semiconductor device 1206 (e.g., a wafer). For instance, the imaging device 1202 may capture an aerial image (e.g., top views) of the semiconductor device 1206 and provide the image to a processor 1204 configured for processing the obtained image. It is contemplated that the metrology system 1200 may include more than one imaging device without departing from the spirit and scope of the present disclosure. Certain metrology systems may provide the abilities to capture both sides of the semiconductor device simultaneously.

The processor 1204 may be implemented utilizing any standalone or embedded computing device (e.g., a computer, a processing unit/circuitry or the like). Upon receiving the image from the imaging device 1202, the processor 1204 may identify one or more targets 1208 present on the wafer 1206 and carry out the various measurement processes described above.

Figure 13:
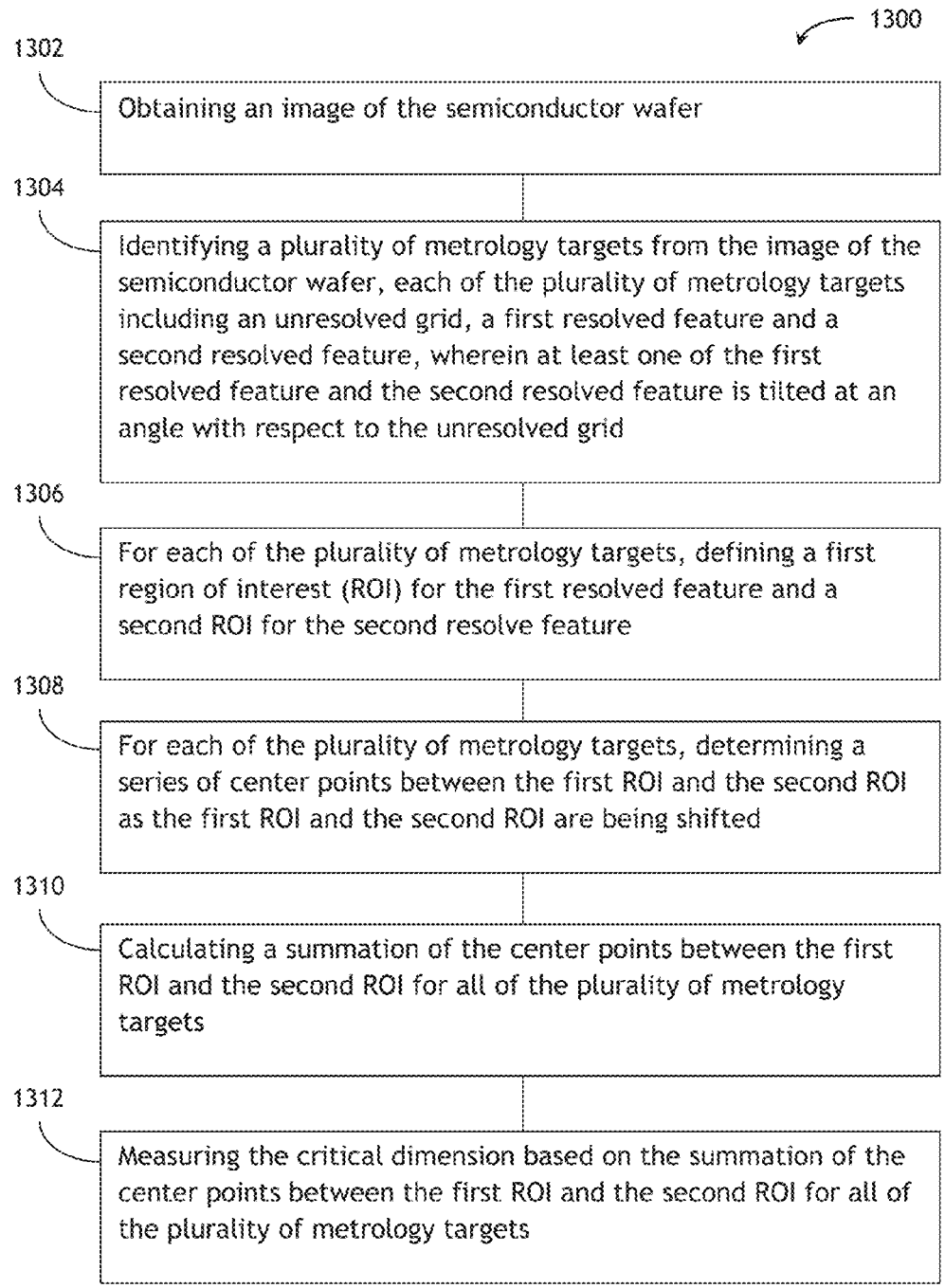
FIG. 13 is a flow diagram illustrating a method for measuring critical dimension (CD) utilizing metrology targets.

For instance, FIG. 13 illustrates a method 1300 for measuring critical dimension (CD) utilizing metrology targets 1208 obtained by the metrology system 1200. Once the image of the semiconductor wafer is obtained in step 1302, step 1304 may then identify a plurality of metrology targets from the image of the semiconductor wafer. Each of the plurality of metrology targets may include an unresolved grid, a first resolved feature and a second resolved feature. As described above, at least one of the resolved features is tilted at an angle with respect to the unresolved grid.

Step 1306 may define two ROI's for each of the plurality of metrology targets. Step 1308 then determines a series of center points between the two ROI's as the ROI's are being shifted for each of the plurality of metrology targets. It is contemplated that discrete center point locations may be determined as the ROI's are being shifted at predefined increments. The predefined increments may be very fine (e.g., at the pixel level, shifting n pixels at a time), in which case the center point locations may form a nearly continuous line. On the other hand, the predefined increments may be relatively sparse, in which case the center point locations may also be relatively spare. It is contemplated that various curve fitting techniques may be utilized to form a continuous curve representing the center points for a particular target.

It is contemplated that the ROI's in each target may be shifted in a substantially similar manner. That is, they may all shift at the same pace. Once the center points between the two ROI's are determined for all targets, step 1310 may calculate a summation of the center points for all targets. As previously described, this summation provides a curve with clear asymmetry that is caused by CD shift, allowing step 1312 to measure the critical dimension based on this summation of the center points.

It is contemplated that the processor 1204 may also be utilized to measure scanner aberrations, displacement of two or more unresolved grids and the like. It is also contemplated that the tilted feature designs in accordance with the present disclosure may also be utilized for other applications as well without departing from the spirit and scope of the present disclosure.

The methods disclosed may be implemented as sets of instructions, through a single production device, and/or through multiple production devices. Further, it is understood that the specific order or hierarchy of steps in the methods disclosed are examples of exemplary approaches. Based upon design preferences, it is understood that the specific order or hierarchy of steps in the method can be rearranged while remaining within the scope and spirit of the disclosure. The accompanying method claims present elements of the various steps in a sample order, and are not necessarily meant to be limited to the specific order or hierarchy presented.

It is believed that the system and method of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:

1. A method for measuring a semiconductor wafer critical dimension, the method comprising:
    obtaining an image of the semiconductor wafer;
    identifying a plurality of metrology targets from the image of the semiconductor wafer, a respective metrology target of the plurality of metrology targets including an unresolved grid, a first resolved feature and a second resolved feature, wherein at least one of the first resolved feature and the second resolved feature is tilted at an angle with respect to the unresolved grid;
    defining a first region of interest (ROI) for the first resolved feature of the respective metrology target of the plurality of metrology targets and a second ROI for the second resolve feature of the respective metrology target of the plurality of metrology targets;
    determining a series of center points between the first ROI and the second ROI as the first ROI and the second ROI are being shifted;
    calculating a summation of the center points between the first ROI and the second ROI defined for the plurality of metrology targets; and
    measuring the critical dimension based on a symmetry analysis of the summation of the center points between the first ROI and the second ROI defined for the plurality of metrology targets.

2. The method of claim 1, wherein the unresolved grid includes a plurality of lines spaced equally apart from each other according to a pre-determined pitch distance.

3. The method of claim 2, wherein the first resolved feature and the second resolved feature each has a width that is a multiple of the pitch distance.

4. The method of claim 2, wherein one of the first resolved feature and the second resolved feature is parallel with respect to the unresolved grid and the other one of the first resolved feature and the second resolved feature is tilted at an angle with respect to the unresolved grid.

5. The method of claim 4, wherein the tilted angle in each particular one of the plurality of metrology targets is unique within the plurality of metrology targets.

6. The method of claim 1, wherein the first ROI and the second ROI are being shifted in substantially a same manner when the series of center points between the first ROI and the second ROI are being determined for each of the plurality of metrology targets.

7. A metrology system, comprising:
    an imaging device, the imaging device configured for obtaining an image of a semiconductor device; and
    a processor, the processor configured for:
        identifying at least one metrology target from the image of the semiconductor device, the at least one metrology target including an unresolved grid having a plurality of lines spaced equally apart from each other according to a pre-determined pitch distance, the at least one metrology target further including at least one resolved feature tilted at an angle with respect to the unresolved grid;
        defining a first region of interest (ROI) and a second ROI for the at least one metrology target;
        determining a series of center points between the first ROI and the second ROI as the first ROI and the second ROI are being shifted; and
        analyzing the semiconductor device based on the series of center points between the first ROI and the second ROI.

8. The metrology system of claim 7, wherein each metrology target includes at least two resolved features, one of the at least two resolved features is parallel with respect to the unresolved grid and the rest of the at least two resolved features are tilted at an angle with respect to the unresolved grid.

9. The metrology system of claim 8, wherein said at least one metrology target identified from the image of the semiconductor device includes a plurality of metrology targets, and wherein said processor is further configured for:
    calculating a summation of the center points between the first ROI and the second ROI defined for the plurality of metrology targets; and
    measuring the critical dimension based on the summation of the center points between the first ROI and the second ROI defined for the plurality of metrology targets.

10. The metrology system of claim 9, wherein the tilted angle in each particular one of the plurality of metrology targets is unique within the plurality of metrology targets.

11. The metrology system of claim 9, wherein the first ROI and the second ROI are being shifted in substantially a same manner when the series of center points between the first ROI and the second ROI are being determined for each of the plurality of metrology targets.

12. The metrology system of claim 7, wherein the at least one resolved feature has a width that is a multiple of the pitch distance.

13. The metrology system of claim 7, wherein said at least one metrology target identified from the image of the semiconductor device includes:
    at least two unresolved grid having different pitch distances;
    an anchor feature parallel with respect to the unresolved grids;
    a first tilted feature tilted at an angle and overlaying with the first unresolved grid; and
    a second tilted feature tilted at the same angle and overlaying with the second unresolved grid; and
    wherein said processor is further configured for:
        defining the first ROI for the first tilted feature;
        defining the second ROI for the second tilted feature;
        defining a third ROI for the anchor feature;
        determining a first series of center points between the first ROI and the third ROI as the first ROI and the third ROI are being shifted;
        determining a second series of center points between the second ROI and the third ROI as the second ROI and the third ROI are being shifted; and
        measuring a scanner aberration based on spectral phase between the first series of center points and the second series of center points.

14. The metrology system of claim 7, wherein said at least one metrology target identified from the image of the semiconductor device includes:
    at least two unresolved grid belonging to different process layers and having a same pitch;
    an anchor feature parallel with respect to the unresolved grids;
    a first tilted feature tilted at an angle and overlaying with the first unresolved grid; and
    a second tilted feature tilted at the same angle and overlaying with the second unresolved grid; and wherein said processor is further configured for:
  defining the first ROI for the first tilted feature;
  defining the second ROI for the second tilted feature;
  defining a third ROI for the anchor feature;
  determining a first series of center points between the first ROI and the third ROI as the first ROI and the third ROI are being shifted;
  determining a second series of center points between the second ROI and the third ROI as the second ROI and the third ROI are being shifted; and
  measuring a displacement of said two unresolved grids based on phase difference between the first series of center points and the second series of center points.

15. A metrology target, comprising:
an unresolved grid including a plurality of lines spaced equally apart from each other according to a pre-determined pitch distance; and
at least one resolved feature overlapping with the unresolved grid and tilted at an angle with respect to the unresolved grid.

16. The metrology target of claim 15, further comprising:
at least one anchor feature parallel with respect to the unresolved grids.

17. The metrology target of claim 15, further comprising:
at least one additional unresolved grid.

18. The metrology target of claim 17, wherein the at least one additional unresolved grid and the first mentioned unresolved grid belong to different wafer layers.

19. The metrology target of claim 17, wherein the at least one additional unresolved grid and the first mentioned unresolved grid have different pitches.

* * * * *